(12) United States Patent
Jung

(10) Patent No.: US 7,981,764 B2
(45) Date of Patent: Jul. 19, 2011

(54) METHOD FOR FABRICATING SEMICONDUCTOR DEVICE WITH VERTICAL GATE

(75) Inventor: Young-Kyun Jung, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 193 days.

(21) Appl. No.: 12/492,892

(22) Filed: Jun. 26, 2009

(65) Prior Publication Data
US 2010/0120220 A1    May 13, 2010

(30) Foreign Application Priority Data

Nov. 13, 2008 (KR) .......................... 10-2008-0112689

(51) Int. Cl.
*H01L 21/76* (2006.01)
(52) U.S. Cl. ........ 438/429; 438/239; 438/243; 438/253; 438/268; 438/270; 257/296; 257/302; 257/306; 257/315; 257/329; 257/E21.41
(58) Field of Classification Search .................. None
See application file for complete search history.

(56) References Cited

U.S. PATENT DOCUMENTS

| 5,578,850 A | 11/1996 | Fitch et al. |
| 2009/0108340 A1* | 4/2009 | Seo .............................. 257/329 |

FOREIGN PATENT DOCUMENTS
KR    1020060041415    5/2006

OTHER PUBLICATIONS

Notice of Preliminary Rejection issued from Korean Intellectual Property Office on Jan. 5, 2011.

* cited by examiner

*Primary Examiner* — N Drew Richards
*Assistant Examiner* — Kyoung Lee
(74) *Attorney, Agent, or Firm* — IP & T Group LLP

(57) ABSTRACT

A method for fabricating a semiconductor device includes: forming a stack structure including pillar regions whose upper portion has a wider width than a lower portion over a substrate, the lower portion including at least a conductive layer; forming a gate insulation layer on sidewalls of the pillar regions; forming active pillars to gap-fill the pillar regions; and forming vertical gates that serve as both gate electrode and word lines by selectively etching the conductive layer.

11 Claims, 4 Drawing Sheets

METHOD FOR FABRICATING SEMICONDUCTOR DEVICE WITH VERTICAL GATE

CROSS-REFERENCE TO RELATED APPLICATIONS

The present application claims priority of Korean Patent Application No. 10-2008-0112689, filed on Nov. 13, 2008, the disclosure of which is incorporated herein by reference in its entirety.

BACKGROUND OF THE INVENTION

The present invention relates to a method for fabricating a semiconductor device, and more particularly, to a semiconductor device with vertical gates.

Recently, there has been an increasing demand for a memory device of under 40 nm dimensions to improve integration degree. Planar or recessed gate transistors used in 8 $F^2$ or 6 $F^2$ cell architecture have a problem in that they cannot be scaled under 40 nm dimensions, where F denotes a minimum feature size. Therefore, a dynamic random access memory (DRAM) having a 4 $F^2$ cell architecture that can improve the integration level by about 1.5 to 2 times compared to known integration levels and have the same scaling level is desirable. Thus, a semiconductor device with vertical gates is used.

A semiconductor device with vertical gates is fabricated by forming a vertical gate electrode surrounding an active pillar region vertically extended over a semiconductor substrate, which will be referred to as active pillars, hereafter. A channel is formed in a vertical direction in the upper and lower portions of the active pillars centering around the gate electrode. The semiconductor device with vertical gates is not restricted by a channel length even if the area of the semiconductor device is decreased.

FIGS. 1A and 1B are cross-sectional views illustrating a conventional method for fabricating a semiconductor device with vertical gates.

Referring to FIG. 1A, a substrate 11 is etched using a protective layer 12 as an etch barrier to thereby form active pillars each having some of its sidewalls recessed and having a neck and a head.

Subsequently, a gate insulation layer 14 is formed on the surfaces of the active pillars 13 and the substrate 11, and then a first conductive layer is deposited and an etch process is performed to thereby form vertical gates 15 surrounding the recessed sidewalls of the active pillars 13.

Subsequently, an interlayer dielectric layer 16 is formed to gap-fill the region between the active pillars 13, and a portion of the interlayer dielectric layer 16 is recessed to expose sidewalls of the vertical gates 15.

Subsequently, a second conductive layer 17 to serve as word lines is deposited.

Referring to FIG. 1B, word lines 17A electrically connecting the vertical gates 15 are formed by performing an etch-back onto the second conductive layer 17.

The conventional technology, however, has a shortcoming where large voids (V) are formed due to the narrow space between the active pillars 13 during the deposition of the second conductive layer 17, which will serve as word lines.

The voids formed in the second conductive layer not only may make it hard to control a subsequent etch-back process but may also cause a problem that all word lines are altogether removed in severely-effected regions (for example, a region indicated by reference numeral '17B').

SUMMARY OF THE INVENTION

An embodiment of the present invention is directed to providing a method for fabricating a semiconductor device with vertical gates that can fundamentally prevent voids from being formed due to the narrow space between active pillars.

In accordance with an aspect of the present invention, there is provided a method for fabricating a semiconductor device, including: forming a stack structure including pillar regions whose upper portion has a wider width than a lower portion over a substrate, the lower portion including at least a conductive layer; forming a gate insulation layer on sidewalls of the pillar regions; forming active pillars to gap-fill the pillar regions; and forming vertical gates that serve as both gate electrode and word lines by selectively etching the conductive layer.

The active pillars may be formed through an epitaxial growth process, and may include an epitaxial silicon layer formed through a selective epitaxial growth (SEG) process. The stack structure may have a structure where the conductive layer is positioned between a dielectric layer and a hard mask layer, and the upper portion may be formed from the hard mask layer whereas the lower portion may be formed from the dielectric layer and the conductive layer. The forming of a stack structure may include: sequentially stacking the dielectric layer, the conductive layer, and the hard mask layer over the substrate; sequentially etching the hard mask layer, the conductive layer, and the dielectric layer to thereby form the pillar regions to thereby produce a hard mask pattern, a conductive pattern, and a dielectric pattern; and widening the upper portion of the pillar regions by performing a selective etch-back on the hard mask pattern.

In accordance with another aspect of the present invention, there is provided a method for fabricating a semiconductor device, including: forming a stack structure including pillar regions over a substrate, wherein each pillar regions has an upper portion and a lower portion that includes at least a conductive layer; forming a gate insulation layer on sidewalls of the pillar regions; forming active pillars to gap-fill the pillar regions; and forming vertical gates that serve as both gate electrode and word lines by selectively etching the conductive layer.

DESCRIPTION OF SPECIFIC EMBODIMENTS

Figure 1A:
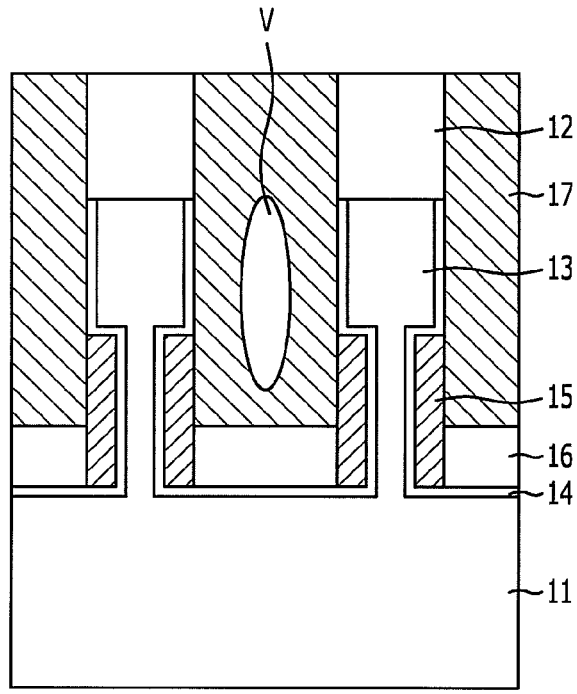
FIGS. 1A and 1B are cross-sectional views illustrating a conventional method for fabricating a semiconductor device with vertical gates.
Figure 1B:
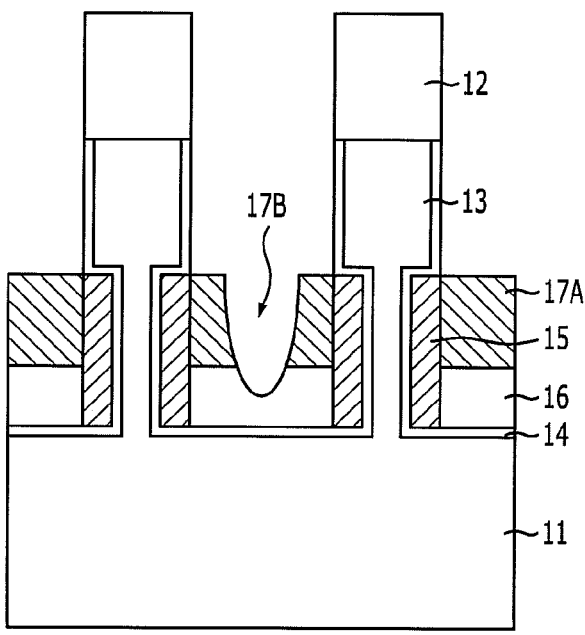

Other objects and advantages of the present invention can be understood by the following description, and become apparent with reference to the embodiments of the present invention.

Referring to the drawings, the illustrated thickness of layers and regions are exemplary and may not be exact. When a first layer is referred to as being "on" a second layer or "on" a substrate, it could mean that the first layer is formed directly on the second layer or the substrate, or it could also mean that a third layer may exist between the first layer and the second layer or the substrate. Furthermore, the same or like reference numerals represent the same or like constituent elements, even if they appear in different embodiments or drawings of the present invention.

FIGS. 2A to 2E are cross-sectional views describing a method for fabricating a semiconductor device with vertical gates in accordance with an embodiment of the present invention.

Figure 2A:
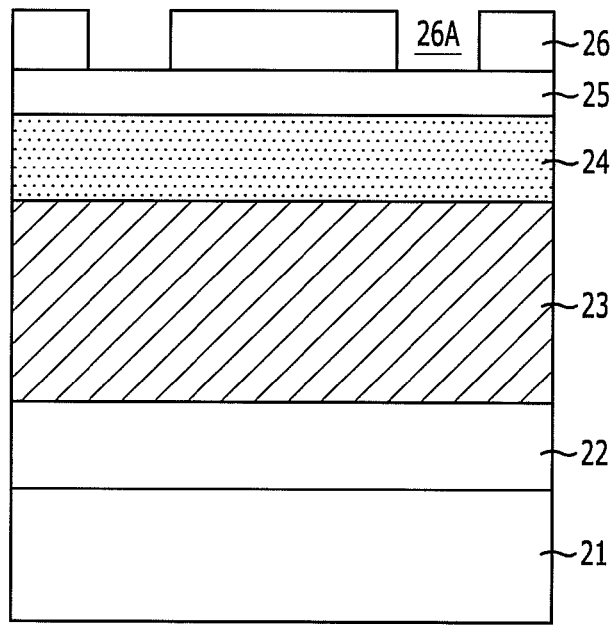
FIGS. 2A to 2E are cross-sectional views describing a method for fabricating a semiconductor device with vertical gates in accordance with an embodiment of the present invention.

Referring to FIG. 2A, an insulation layer 22 and a conductive layer 23 are sequentially deposited over a substrate 21. The insulation layer 22 may be a nitride layer, e.g., silicon nitride ($Si_3N_4$), or an oxide layer, e.g., silicon oxide ($SiO_2$), plasma enhanced tetraethyoxysilane (PETEOS), phosphor-silicate glass (PSG), undoped silicate glass (USG), and high-density plasma (HDP). The conductive layer 23 may include a metal layer or a polysilicon layer. The conductive layer 23 may be a metal layer having a lower sheet resistance than a polysilicon layer. For instance, the conductive layer 23 may include any one metal layer selected from the group consisting of tungsten (W), aluminum (Al), copper (Cu), gold (Au) and ruthenium (Ru), and it may be formed through Atomic Layer Deposition (ALD), Physical Vapor Deposition (PVD), Chemical Vapor Deposition (CVD). The conductive layer 23 has a thickness of equal to or higher than approximately 50 Å.

Subsequently, a hard mask layer 24 is formed over the conductive layer 23. The hard mask layer 24 is formed of a material having a high selectivity during an etch process of the conductive layer 23 and the insulation layer 22. The hard mask layer 24 may be formed of amorphous carbon.

Subsequently, a pillar mask 26 is formed using a photoresist layer. An anti-reflective coating (ARC) layer 25 may be formed below the pillar mask 26 to prevent scattered reflection during a photolithography process. The ARC layer 25 may include a siliconoxynitride (SiON) layer. The pillar mask 26 is a mask introduced to form active pillars and it has openings 26A defining the active pillars. Herein, the openings 26A may be circular or polygonal when they are looked over in a plan view.

Figure 2B:
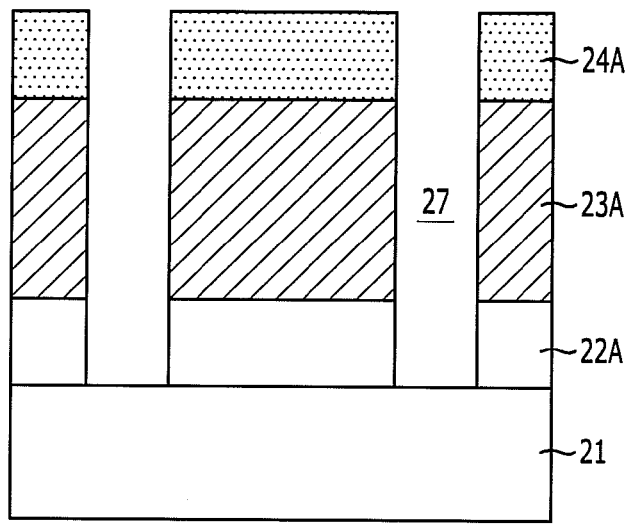

Referring to FIG. 2B, a pillar etch process is performed. The ARC layer 25 and the hard mask layer 24 are etched using the pillar mask 26 as an etch barrier, and then the conductive layer 23 and the insulation layer 22 are etched. After the insulation layer 22 is etched, the pillar mask 26 and the ARC layer 25 may be etched away completely. Also, the pillar mask 26 and the ARC layer 25 may be removed after the hard mask layer 24 is etched, and then the conductive layer 23 and the insulation layer 22 may be etched using the hard mask layer 24 as an etch barrier.

The pillar etch process opens pillar regions 27 to thereby expose the surface of the substrate 21. Since the pillar regions 27 have a form transferred from the openings of the pillar mask 26, they may have the shape of circular or polygonal holes. The pillar regions 27 have a shape of damascene pattern to be filled by the active pillars. The etched insulation layer 22, the etched conductive layer 23, and the etched hard mask layer 24 are referred to as an insulation pattern 22A, a conductive pattern 23A, and a first hard mask pattern 24A, respectively, hereafter.

Figure 2C:
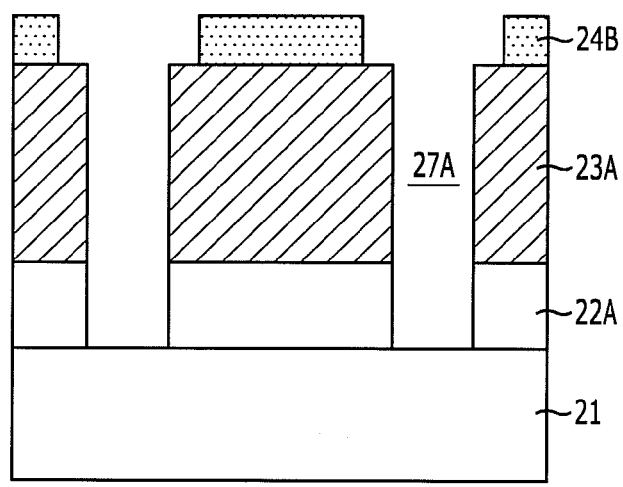

Referring to FIG. 2C, a shrink process is performed onto the first hard mask pattern 24A. The shrink process of the first hard mask pattern 24A may be an etch-back process, and the etch-back process removes the sidewalls of the first hard mask pattern 24A by approximately 100 Å. The first hard mask pattern 24A also loses a portion from its surface to thereby become a second hard mask pattern 24B.

As described above, a pillar region pattern 27A with wide openings are formed as a result of the shrink process of the first hard mask pattern 24A. In short, the pillar region pattern 27A comes to have a structure where the upper region (which is provided by the second hard mask pattern 24A) has a wider width than the lower region (which is provided by a stack structure of the conductive pattern 23A and the insulation pattern 22A). This structure is to form active pillars with some of their sidewalls recessed. The upper region corresponds to a head, whereas the lower region corresponds to a neck which provides recessed sidewalls.

After all, a stack structure where the insulation pattern 22A, the conductive pattern 23A, and the second hard mask pattern 24B are sequentially stacked is formed in the upper portion of the substrate 21, and the stack structure has the pillar region pattern 27A whose upper region has a wider width than the lower region. Therefore, the stack structure comes to include at least the conductive pattern 23A. Since the conductive pattern 23A becomes vertical gates through a subsequent etch process, it can be said that a conductive layer to serve as vertical gates is formed in advance before the formation of active pillars according to the method of the present invention.

Figure 2D:
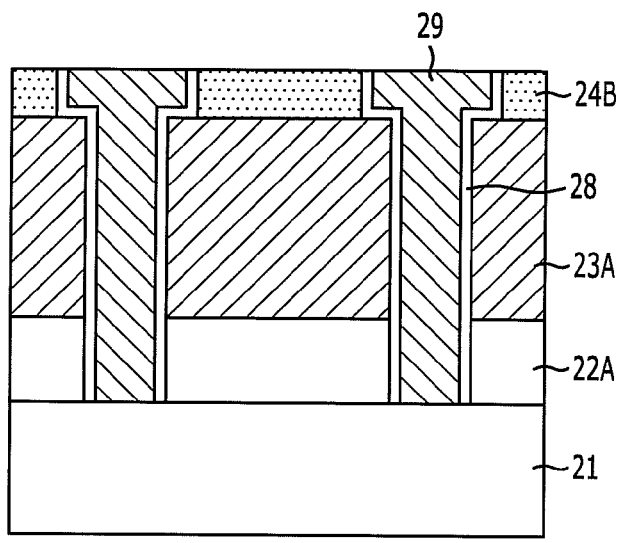

Referring to FIG. 2D, a gate insulation layer 28 is formed. The gate insulation layer 28 may include a silicon oxide layer, and the gate insulation layer 28 may be formed through a deposition process or an oxidizing process. Meanwhile, a buried bit line line-etch process may be performed before the formation of the gate insulation layer 28.

The gate insulation layer 28 is etched through an etch process, such as an etch-back process, to expose the surface of the substrate 21. Accordingly, the gate insulation layer 28 remains only on the sidewalls of the pillar region pattern 27A.

Subsequently, active pillars 29 are formed to gap-fill the pillar region pattern 27A through an epitaxial growth process.

The active pillars 29 may include an epitaxial silicon layer, and the epitaxial growth may be a selective epitaxial growth (SEG) process.

The epitaxial growth process may be performed at a temperature higher than approximately 15° C. When the active pillars 29 are epitaxial silicon layer, a slain ($SiH_4$) gas may serve as a source material.

Figure 2E:
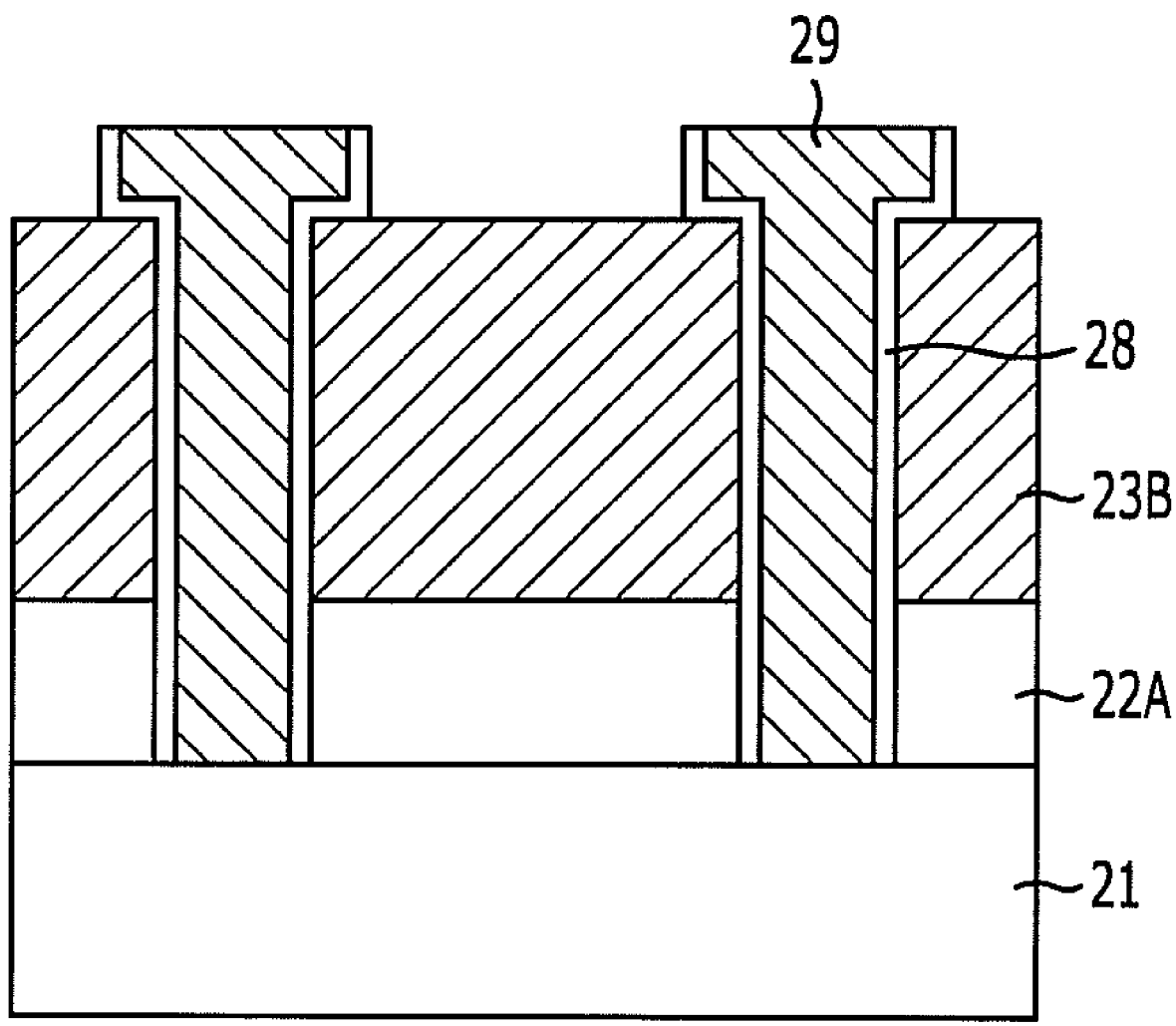

Referring to FIG. 2E, the conductive pattern 23A is selectively etched to thereby form vertical gates 23B. Herein, since the drawing illustrates a cross-section cut in the direction of word lines, the conductive pattern 23A and the vertical gates 23B are shown without any change in their shape. However, the conductive pattern 23A positioned between the word lines is selectively etched and the vertical gates 23B shown in FIG. 2E are connected in the direction of the word lines. In other words, the method of the present invention does not separately form a gate electrode and word lines but forms the vertical gates to serve as word lines as well. Before the conductive pattern 23A is etched, the second hard mask pattern 24B is etched using a word line mask (not shown) formed by using a photoresist layer.

Subsequently, the second hard mask pattern 24B is removed. When the second hard mask pattern 24B is an amorphous carbon layer, it may be removed through a strip process using oxygen ($O_2$) plasma.

The resultant structure obtained after the second hard mask pattern 24B is removed includes the active pillars 29 formed over the substrate 21. The active pillars 29 have a form of gap-filling the pillar regions in the stack structure. To sum up, the method of the present invention forms the active pillars through the epitaxial growth process, while the conventional method forms active pillars by etching a substrate.

The method of the present invention described above can prevent voids from being formed during the deposition of a conductive layer by forming a conductive layer which will serve as both vertical gates and word lines in advance before active pillars are formed.

Also, since a gate electrode and word lines are formed of the same material, a semiconductor device with relatively superior interface between the gate electrode and the word lines is fabricated.

In this way, the structure of vertical gates used in a memory device of under 30 nm dimensions may be formed stably, and a semiconductor device with relatively superior operation performance may be realized.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
   forming a stack structure including pillar regions whose upper portion has a wider width than a lower portion over a substrate, the lower portion including at least a conductive layer;
   forming a gate insulation layer on sidewalls of the pillar regions;
   forming active pillars to gap-fill the pillar regions; and
   forming vertical gates that serve as both gate electrode and word lines by selectively etching the conductive layer.

2. The method of claim 1, wherein the active pillars are formed through an epitaxial growth process.

3. The method of claim 1, wherein the active pillars include an epitaxial silicon layer formed through a selective epitaxial growth (SEG) process.

4. The method of claim 1, wherein the stack structure has a structure where the conductive layer is positioned between a dielectric layer and a hard mask layer, and the upper portion is formed from the hard mask layer whereas the lower portion is formed from the dielectric layer and the conductive layer.

5. The method of claim 4, wherein the forming of a stack structure includes:
   sequentially stacking the dielectric layer, the conductive layer, and the hard mask layer over the substrate;
   sequentially etching the hard mask layer, the conductive layer, and the dielectric layer to thereby form the pillar regions to thereby produce a hard mask pattern, a conductive pattern, and a dielectric pattern; and
   widening the upper portion of the pillar regions by performing a selective etch-back on the hard mask pattern.

6. The method of claim 5, wherein the hard mask layer includes an amorphous carbon layer.

7. The method of claim 5, wherein the conductive layer includes a tungsten layer.

8. A method for fabricating a semiconductor device, comprising:
   forming a stack structure including pillar regions over a substrate, wherein each pillar regions has an upper portion and a lower portion that includes at least a conductive layer;
   forming a gate insulation layer on sidewalls of the pillar regions;
   forming active pillars to gap-fill the pillar regions; and
   forming vertical gates that serve as both gate electrode and word lines by selectively etching the conductive layer.

9. The method of claim 8, wherein the upper portion of each pillar region has a wider width than the lower portion of the pillar region.

10. The method of claim 8, wherein the active pillars are formed through an epitaxial growth process.

11. The method of claim 8, wherein the active pillars include an epitaxial silicon layer formed through a selective epitaxial growth (SEG) process.

* * * * *